United States Patent [19]
Tang et al.

[11] Patent Number: 6,048,573
[45] Date of Patent: Apr. 11, 2000

[54] METHOD OF MAKING AN ORGANIC LIGHT-EMITTING DEVICE

[75] Inventors: Ching W. Tang, Rochester; Kee-Chuan Pan, Pittsford, both of N.Y.

[73] Assignee: Eastman Kodak Company, Rochester, N.Y.

[21] Appl. No.: 09/192,066

[22] Filed: Nov. 13, 1998

[51] Int. Cl.[7] .............................. B05D 5/06; B05D 5/12
[52] U.S. Cl. ................................. 427/66; 427/69; 427/70
[58] Field of Search ................................ 427/66, 69, 70, 427/64; 313/504

[56] References Cited

U.S. PATENT DOCUMENTS

| | | |
|---|---|---|
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. ............................. 428/690 |
| 5,150,006 | 9/1992 | VanSlyke et al. . |
| 5,194,290 | 3/1993 | Robertson .............................. 427/526 |

*Primary Examiner*—Shrive Beck
*Assistant Examiner*—Michael Cleveland
*Attorney, Agent, or Firm*—Raymond L. Owens

[57] ABSTRACT

A method of making an organic light-emitting device is disclosed in which a dopant layer is formed adjacent to a light-emitting layer containing a light-emitting host material. The dopant is diffused from the dopant layer into the light-emitting layer by exposing the light-emitting layer and the dopant layer to vapor of a fluid or fluid mixture. The method permits doping of a light-emitting layer with one dopant or with multiple dopants so as to modify the color and efficiency of light emitted from the light-emitting layer.

42 Claims, 10 Drawing Sheets

METHOD OF MAKING AN ORGANIC LIGHT-EMITTING DEVICE

FIELD OF THE INVENTION

The present invention relates to methods of making organic light-emitting devices and, more particularly to methods of providing in a light-emitting layer of an organic light-emitting device a dopant capable of modifying light emitted from the device.

BACKGROUND OF THE INVENTION

Organic light-emitting devices, also referred to as organic electroluminescent (EL) devices or as organic internal junction light-emitting devices, contain spaced electrodes separated by an organic light-emitting structure (also referred to as an organic EL medium) which emits light in response to the application of an electrical potential difference across the electrodes. At least one of the electrodes is light-transmissive, and the organic light-emitting structure can have a multi-layer of organic thin films which provide for hole injection and transport from an anode, and for electron injection and transport from a cathode, respectively, with light emission resulting from electron-hole recombination at an internal junction formed at an interface between the hole-transporting and the electron-transporting thin films. As employed herein, the term "thin film" refers to layer thicknesses of less than 1 micrometer with layer thickness of less than about 0.5 micrometer being typical. Examples of organic light-emitting devices containing organic light-emitting structures and cathode constructions formed by thin film deposition techniques are provided by Tang U.S. Pat. No. 4,356,429; VanSlyke et al., U.S. Pat. Nos. 4,539,507 and 4,720,432; and Tang et al., U.S. Pat. No. 4,769,292.

During operation of an organic light-emitting device, the spectral distribution of emitted light (measured in terms of spectral radiance) is related to the electroluminescent properties of the organic thin films used in the device construction. For example, if an organic light-emitting structure includes a layer which contains a light-emitting host material, the emitted light will be dominated by the light emission from the host material.

Tang et al., in the above-cited U.S. Pat. No. 4,769,292 recognized that advantageous performance features of an organic light-emitting device could be obtained if the device included a luminescent zone (or light-emitting layer) of less than 1 micrometer in thickness and comprised of an organic host material capable of sustaining hole-electron recombination, and a small amount of fluorescent material capable of emitting light in response to energy released by hole-electron recombination. The introduction of a fluorescent material into a layer of a light-emitting host material will modify the color of the light emission, and can improve the operational stability of an organic light-emitting device. In analogy to terminology used in the semiconductor industry, fluorescent materials dispersed uniformly at relatively low concentration in light-emitting organic host materials are called "dopants."

As currently practiced, the organic thin films of a light-emitting device are formed by vapor deposition (evaporation or sublimation) in successive deposition steps within a vacuum system which employs a deposition rate control. When a fluorescent dopant is to be uniformly incorporated within an organic light-emitting layer, the light-emitting host material and the fluorescent dopant material are co-deposited from two independently controlled deposition sources. It has been found to be difficult to reliably control the deposition rate of a fluorescent dopant when a desired dopant concentration in the host material of the organic light-emitting layer is at or near a lower end of a dopant concentration range of $10^{-3}$ to about 10 mole percent. The difficulty of reliably controlling the deposition rates of an organic light-emitting host material and of a fluorescent dopant material has been an obstacle in the process of reproducibly fabricating organic electroluminescent devices containing a fluorescent dopant or fluorescent dopants.

SUMMARY OF THE INVENTION

The present invention has as its purpose to separate the deposition of the organic host material forming the light-emitting layer from the deposition of an organic dopant material, and to introduce the dopant material into the host material during a subsequent processing step.

Accordingly, it is an object of the present invention to provide a method of making an organic light-emitting device by forming a light-emitting layer of a light-emitting host material, forming at least one organic dopant layer adjacent to the light-emitting layer, and diffusing the dopant from the dopant layer into the light-emitting layer.

In one aspect, this object is achieved by the steps of:

a) providing a substrate;

b) disposing an anode over the substrate;

c) forming an organic hole-transporting layer over the anode;

d) forming an organic light-emitting layer over the hole-transporting layer and of a light-emitting host material selected to produce a host light emission;

e) forming at least one organic dopant layer over the light-emitting layer and of a dopant selected to modify the host light emission of the host material;

f) diffusing the dopant from the dopant layer into the light-emitting layer, thereby modifying the host light emission;

g) forming an organic electron-transporting layer over the light-emitting layer; and h) dispersing a cathode over the electron-transporting layer.

In another aspect of the invention, this object is achieved by forming a first organic light-emitting layer, forming at least one organic dopant layer over the first light-emitting layer, forming a second organic light-emitting layer over the dopant layer, and diffusing the dopant from the dopant layer into the first and second light-emitting layers.

In a further aspect of the invention, this object is achieved by first forming at least one organic dopant layer, forming an organic light-emitting layer over the dopant layer, and diffusing the dopant from the dopant layer into the light-emitting layer.

BRIEF DESCRIPTION OF THE DRAWINGS

FIGS. 3A–3D show a sequence of process steps for making an organic light-emitting device in accordance with one aspect of the present invention, wherein FIG. 3A depicts a substrate, an anode disposed over the substrate, and organic hole-transporting layer formed over the anode, and an organic light-emitting layer formed over the hole-transporting layer;

FIG. 3B indicates the forming of an organic dopant layer over the light-emitting layer;

FIG. 3C shows schematically by dashed arrows vapor of a fluid being effective in diffusing the dopant from the dopant layer of FIG. 3B uniformly throughout the light-emitting layer;

FIG. 3D indicates the step of forming an organic electron-transporting layer over the doped light-emitting layer, followed by disposing a cathode over the electron-transporting layer;

FIGS. 5A–5D show schematically a process sequence for making an organic light-emitting device in accordance with another aspect of the present invention, in which FIG. 5A shows a dopant layer formed over a hole-transporting layer;

FIG. 5B shows an organic light-emitting layer formed over the dopant layer;

FIG. 5C indicates the use of fluid vapor treatment for diffusing the dopant material from the dopant layer into the light-emitting layer to be uniformly dispersed therein;

FIG. 5D shows an organic electron-transporting layer formed over the doped light-emitting layer, and a cathode formed over the electron-transporting layer;

FIGS. 6A–6D show a process sequence for making an organic light-emitting device in accordance with another aspect of the present invention, in which FIG. 6A depicts a first light-emitting layer formed over an organic hole-transporting layer, and a dopant layer formed over the first light-emitting layer;

FIG. 6B shows a second light-emitting layer formed over the dopant layer;

FIG. 6C shows a fluid vapor treatment step for diffusing the dopant from the dopant layer into both the first and second light-emitting layers to form a single doped light-emitting layer;

FIG. 6D shows a completed device with an organic electron-transporting layer formed over the doped light-emitting layer, and a cathode formed over the electron-transporting layer;

FIGS. 8A and 8B indicate schematically a vapor treatment system useful for diffusing a dopant from a dopant layer into and uniformly throughout an organic light-emitting layer, wherein FIG. 8A shows a container for containing a fluid which provides fluid vapor, and a sliding cover over the container and adapted to receive a device for vapor treatment to diffuse a dopant from a dopant layer uniformly into a light-emitting layer;

FIG. 8B shows the device in a vapor treatment position to effect dopant diffusion into the light-emitting layer;

The drawings of the devices are necessarily of a schematic nature, since the thicknesses of the individual layers are too thin, and thickness differences of the various elements too great to permit depiction to scale or to permit convenient proportionate scaling.

ADVANTAGES

By separating the depositing step of an organic light-emitting layer from the depositing step of a fluorescent dopant layer, each of these layers can be formed separately to a desired thickness, thereby obviating the problems of deposition rate control associated with the prior art method of forming a doped light-emitting layer. Thus, the deposition processes are greatly simplified and require equipment of reduced complexity.

The light-emitting layer of the organic light-emitting host material can be formed by conventional vapor deposition (evaporation, sublimation) and, alternatively, by solution coating of a polymeric organic light-emitting host material.

The dopant layer can be formed by conventional vapor deposition and, alternatively, by thermally induced transfer from a dopant donor layer formed on a donor support.

Two or more dopant layers containing different dopants can be formed adjacent to a light-emitting layer, thereby providing a broader range of options for modifying the light emitted from the light-emitting layer.

Diffusion of a dopant or of dopants from a dopant layer or from dopant layers into an organic light-emitting layer by a fluid vapor treatment process requires relatively simple equipment and provides for relatively rapid processing to achieve uniform dispersion of the dopant or dopants throughout the organic light-emitting layer of the host material.

DESCRIPTION OF THE PREFERRED EMBODIMENTS

In the following description of the various methods and process sequences used for making an organic light-emitting device in accordance with aspects of the invention, corresponding elements have been designated with corresponding numerals. Exceptions to this correspondence will be discussed in detail as they arise.

Figure 1:
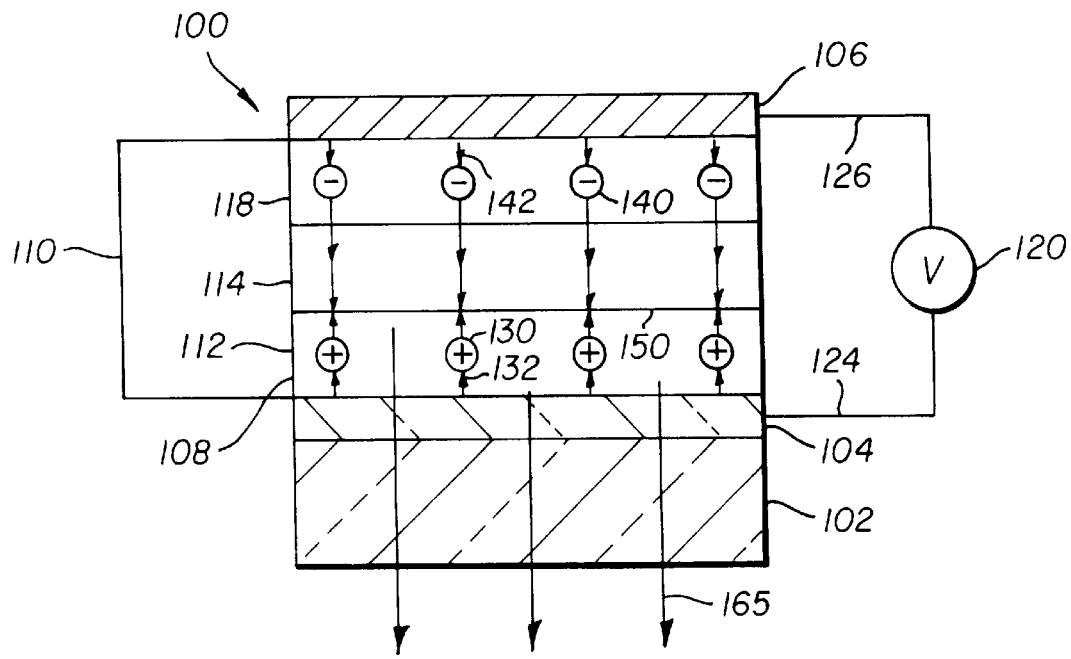
FIG. 1 is a schematic diagram of an organic light-emitting device having an organic light-emitting structure comprised of three organic layers which include an undoped middle layer of a light-emitting host material. Under an applied electrical potential between the electrodes of the device, injection and transport of electrons and holes is shown schematically, with hole-electron recombination at a junction resulting in emitted light which is reflective of the host material in the light-emitting layer.

Turning now to FIG. 1, an organic light-emitting device 100 shows, in sequence, a light-transmissive substrate 102, a light-transmissive anode 104, an organic light-emitting structure 110 formed over the anode, and a cathode 106 provided over the light-emitting structure. The organic light-emitting structure 110 comprises, in sequence, a hole-transporting layer 112, a light-emitting layer 114, and an electron-transporting layer 118. A junction 150 is formed at an interface between the hole-transporting layer 112 and the light-emitting layer 114 which is also capable of transporting electrons.

The anode and cathode are connected to an external power source (drive voltage supply) by leads 124 and 126, respectively. The source 120 can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The internal junction organic light-emitting device can be viewed as a diode which is forward biased when the anode is at a more positive potential than the cathode. Under these conditions, injection of holes 130 occurs from the anode 104 into the hole-transporting layer 112 as schematically shown by arrows 132, while electrons 140 are injected from the cathode 106 into the electron-transporting layer 118 as schematically shown by arrows 142. The injected holes and electrons each migrate toward the oppositely charged electrode, and hole-electron recombination occurs at or near the junction 150. When a migrating electron drops from its conduction band potential to a valance band in filling a hole, energy is released as light. Depending upon the choice of alternative constructions, the released light can be emitted from the light-emitting structure 110 through one or more side surfaces 108 or, as is usually preferred, the light is emitted through the light-transmissive anode 104 and the light-transmissive substrate 102 as indicated by the straight arrows 165. This emitted light substantially corresponds to light-emitting properties of a light-emitting organic host material of which the light-emitting layer 114 is constructed.

Figure 2:
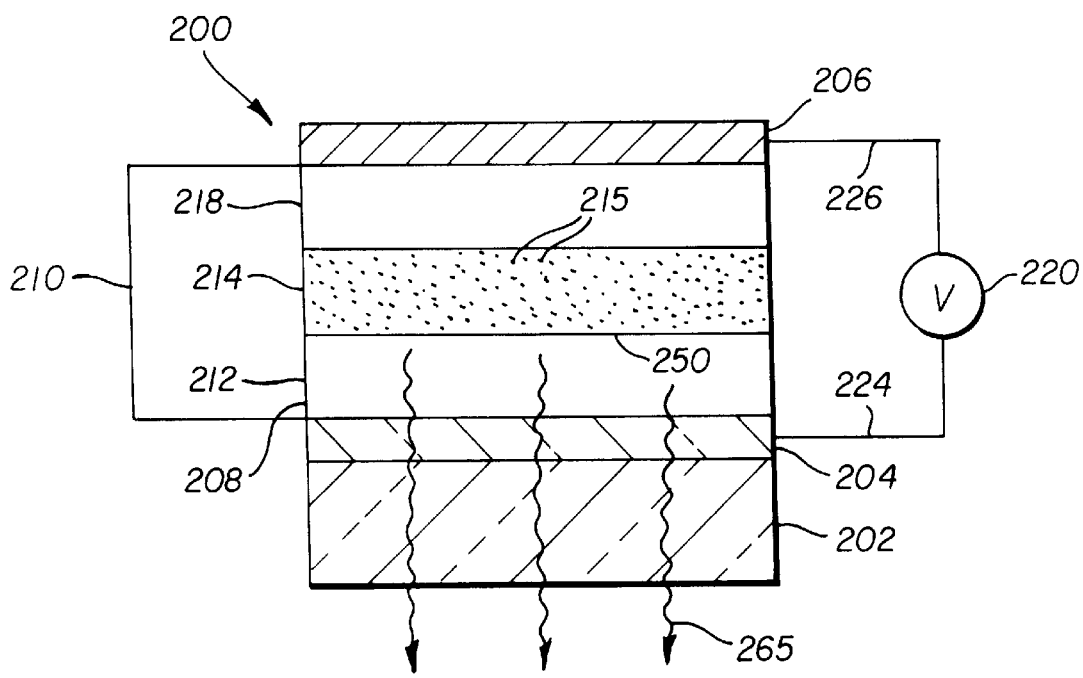
FIG. 2 depicts an organic light-emitting device which has a dopant uniformly dispersed throughout a light-emitting layer, resulting in light emission from the device which is modified by the dopant compared to the light emitted by the device of FIG. 1.

Turning now to FIG. 2, the organic light-emitting device 200 differs from the device of FIG. 1 in that the light-emitting layer 214 contains a dopant 215 selected to modify the host light emission of the host material, as schematically indicated by wavy arrows 265.

Turning now to FIGS. 3A–3D, there is shown a sequence of process steps which, taken together, illustrate one method of making an organic light-emitting device in accordance with the present invention.

Figure 3A:
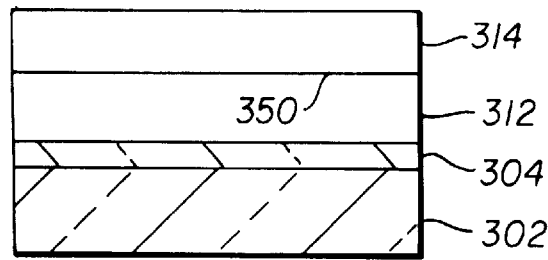

In FIG. 3A, a light-transmissive anode 304 is provided over a light-transmissive substrate 302. Formed over the anode is an organic hole-transporting layer 312, and an organic light-emitting layer 314 is formed over the hole-transporting layer. A junction 350 is indicated at an interface between the hole-transporting layer 312 and the light-emitting layer 314 which is also capable of transporting electrons therethrough.

The light-transmissive substrate 302 is electrically insulative and can be selected from glass, quartz, and plastic materials. The anode 304 is preferably formed of an anode material selected to provide hole injection from the anode into the hole-transporting layer 312. Suitable anode materials include indium oxide, tin oxide, and indium tin oxide (ITO). The hole-transporting layer 312 is preferably formed over the anode by vapor depositing an organic hole-transporting material. Following the teachings of VanSlyke et al., U.S. Pat. No. 4,539,507, the hole-transporting material is preferably selected from the group consisting of aromatic tertiary amines.

The organic light-emitting layer 314 can be formed by vapor depositing an organic light-emitting host material to a desired thickness. Particularly preferred host materials for forming the light-emitting layer 314 are metal chelated oxinoid compounds, as disclosed in the Tang et al. U.S. Pat. No. 4,769,292 cited above. Particularly preferred metal chelated oxinoid compounds are mixed ligand aluminum chelates as the type disclosed by VanSlyke et al., U.S. Pat. No. 5,150,006.

Alternatively, the light-emitting layer 314 can be formed by solution coating of a polymeric organic light-emitting host material. Examples of polymeric light-emitting host materials suitable for solution coating include polyphenylene vinylenes (PPV), PPV copolymers, polyanilines, poly-3-alkylthiophenes, poly-3-octylthiophenes, and polyparaphenylenes, following the teachings of Richard Friend et al disclosed in U.S. Pat. No. 5,807,627, the disclosure of which is incorporated herein by reference.

Figure 3B:
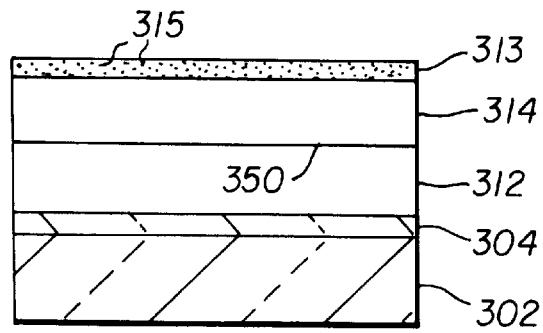

Turning now to FIG. 3B, a dopant layer 313 is formed over the light-emitting layer 314. The dopant layer contains a fluorescent dopant 315, shown in dotted outline, which, when diffused into the underlying light-emitting layer, will modify the light emitted from the host material. The dopant layer 313 can be formed by conventional vacuum vapor deposition of a fluorescent dye functioning as a dopant in a light-emitting host material. Alternatively, the dopant layer can be formed by thermal transfer of a dopant donor layer disposed on a donor support, as will be discussed in greater detail with reference to FIGS. 7A–7C. Forming the dopant layer 313 by either of the aforementioned deposition methods, particularly preferred dopants are fluorescent dyes which are capable of emitting light in response to hole-electron recombination at or near the junction 350, thereby modifying the light emitted from the host material. Following the teachings of Tang et al., in the above cited U.S. Pat. No. 4,769,292, especially preferred fluorescent dyes are those selected from the dye classes consisting of coumarin, dicyanomethylenepyrans and thiopyrans, polymethine, oxabenzanthracene, xanthene, pyrylium and thiapyrylium, carbostyril, and perylene fluorescent dyes.

Figure 3C:
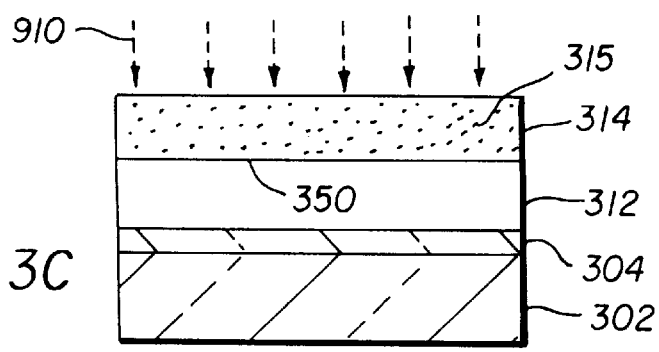

Turning now to FIG. 3C, there is schematically depicted a dopant layer diffusion step in which the dopant layer 313 of FIG. 3B and the light-emitting layer 314 are exposed to vapor of a fluid or of a fluid mixture selected to provide molecular diffusion paths in the light-emitting layer so as to permit uniform diffusion of the dopant 315 throughout the host material of the light-emitting layer 314. The fluid vapor 910 is schematically indicated by dashed arrows, and the fluid vapor treatment process and system will be described in more detail with reference to FIGS. 8A and 8B. As depicted in FIG. 3C, the dopant material 315 is now uniformly dispersed throughout the light-emitting host material of the layer 314, and no residue of the dopant in the dopant layer 313 of FIG. 3B remains on the surface of the layer 314 after the diffusion step. Depending upon the host material comprising the layer 314 in FIG. 3B, and upon the effectiveness of the fluid vapor 910 in creating molecular diffusion paths in the light-emitting host material, all of the dopant 315 in the dopant layer 313 of FIG. 3B can be diffused into the light-emitting layer during a diffusion time ranging from a few seconds to about 30 seconds.

Figure 3D:
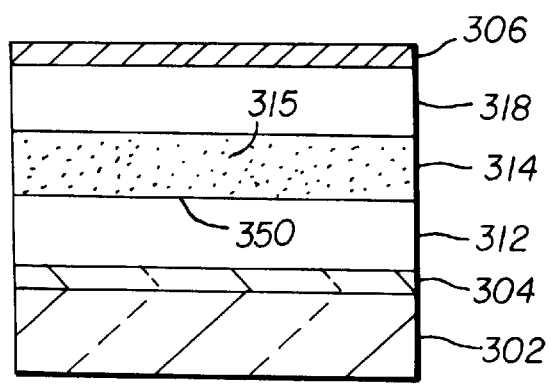

Turning now to FIG. 3D, there is shown a completed organic light-emitting device 300, in which an electron-transporting layer 318 is formed over the now doped light-emitting layer 314, and a cathode 306 is shown disposed over the electron-transporting layer.

The electron-transporting layer 318 is preferably formed by vapor depositing an organic electron-transporting material which is also preferably a metal chelated oxinoid compound. The cathode 306 can be vapor deposited, and of a cathode material selected to provide electron injection from the cathode into the electron-transporting layer 318. Following the teachings of Tang et al. in the aforementioned U.S. Pat. No. 4,769,292, particularly preferred cathode materials are composite materials comprised of a low work function metal (a work function smaller than 4.0 eV) and a second metal which preferably has a work function greater than 4.0 eV, which includes metals more resistant to oxidation and which are therefore more commonly fabricated as metallic layers.

Figure 4A:
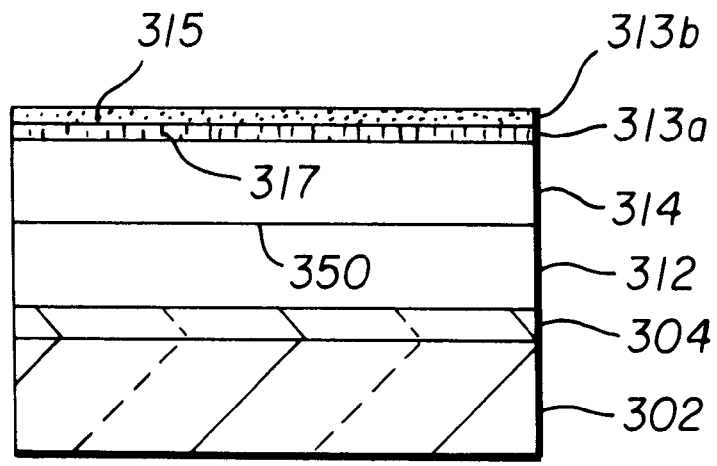
FIG. 4A shows schematically a first dopant layer formed over an organic light-emitting layer, and a second dopant layer formed over the first dopant layer in accordance with another aspect of the present invention.
Figure 4B:
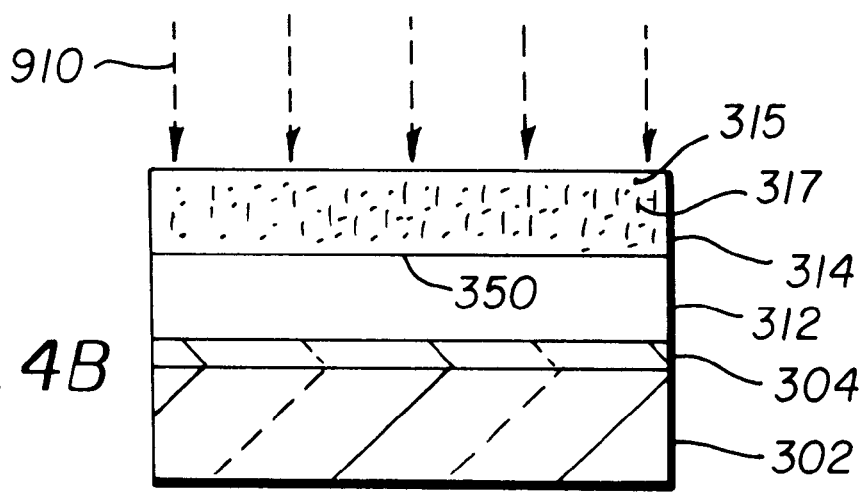
FIG. 4B indicates the use of fluid vapor treatment for diffusing both dopants from the dopant layers uniformly into and throughout the light-emitting layer.

Turning now to FIGS. 4A and 4B, there is shown another aspect of the present invention, in that a method is provided of forming a first dopant layer 313a containing a dopant material 317 over the light-emitting layer 314, and forming a second dopant layer 313b which contains a dopant material 315 over the first dopant layer.

In FIG. 4B the dopants 317 and 315 are shown uniformly diffused throughout the light-emitting layer 314 by action of the fluid vapor 910 in a manner as previously described.

Figure 5A:
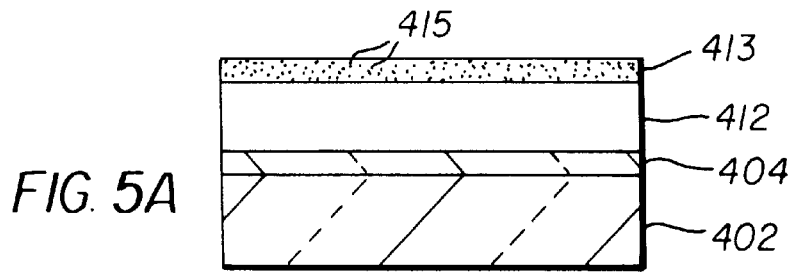
Figure 5B:
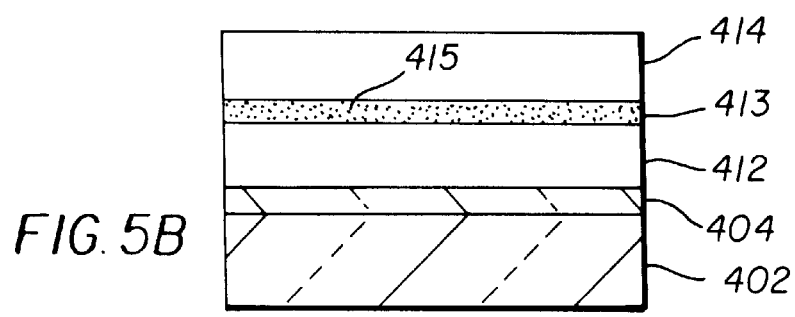

Turning now to FIGS. 5A–5D, a dopant layer 413, containing a dopant material 415, is formed over a hole-transporting layer 412 by either a method of vacuum vapor deposition or by a method of thermal transfer of a dopant donor layer disposed on a donor support. A light-emitting layer 414 of a light-emitting host material is formed over the dopant layer 413, as shown in FIG. 5B.

Figure 5C:
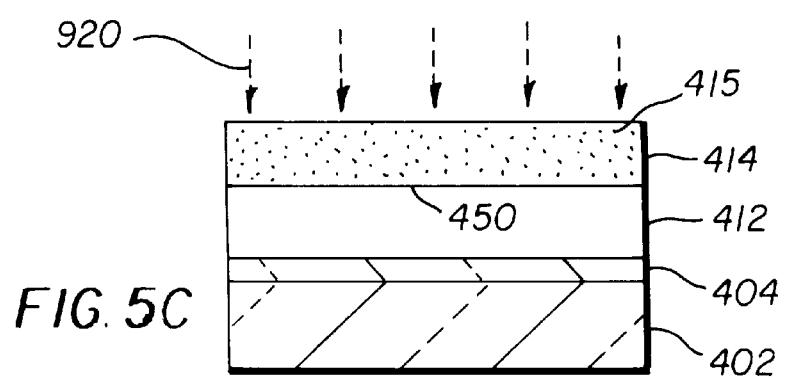

In FIG. 5C, fluid vapor 920 creates molecular diffusion paths in the light-emitting layer 414 and promotes diffusion of the dopant 415 in the dopant layer 413 into the light-emitting layer. While it may appear from the drawings of FIGS. 5B and 5C that the doped light-emitting layer 414 could be lifted off the hole-transporting layer 412 when the dopant layer 413 in FIG. 5B substantially vanishes as the dopant 415 diffuses upwardly into the light-emitting layer 414, it will be appreciated that the dopant layer 413 is formed to a thickness in a range of 0.1–1 nm (1–10 Angstrom), i.e. to a thickness of molecular dimensions.

Figure 5D:
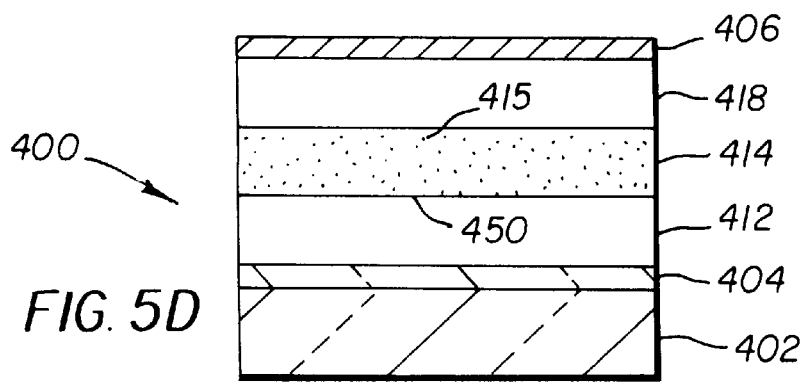

FIG. 5D depicts a completed organic light-emitting device 400 constructed in accordance with the methods of the present invention.

Figure 6A:
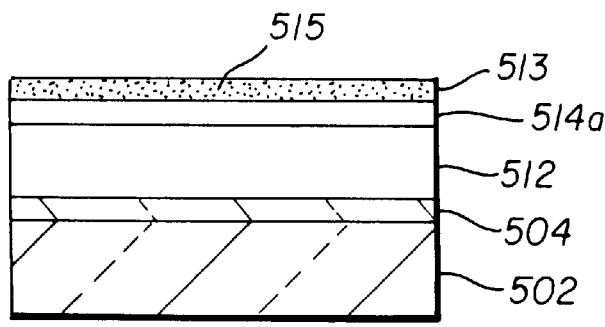
Figure 6B:
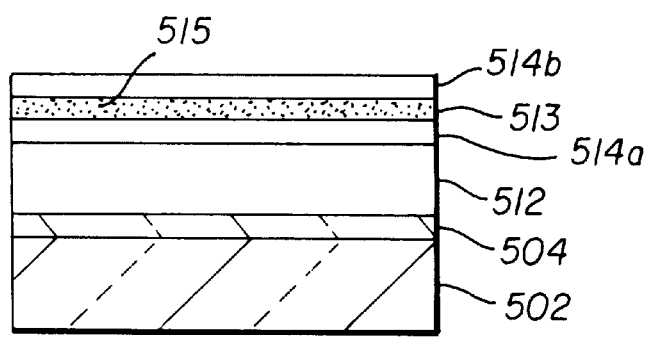

Turning now to FIGS. 6A–6D, a first light-emitting layer 514a is formed over a hole-transporting layer 512. A dopant layer 513 containing a dopant material 515 is formed over the first light-emitting layer. As shown in FIG. 6B, a second light-emitting layer 514b is formed over the dopant layer 513. Thus, the thin (0.1–1.0 nm) dopant layer 513 is sandwiched between two undoped light-emitting layers which may comprise two different light-emitting host materials. If two different light-emitting host materials are used, two distinct light-emitting layers remain after the dopant is diffused.

Figure 6C:
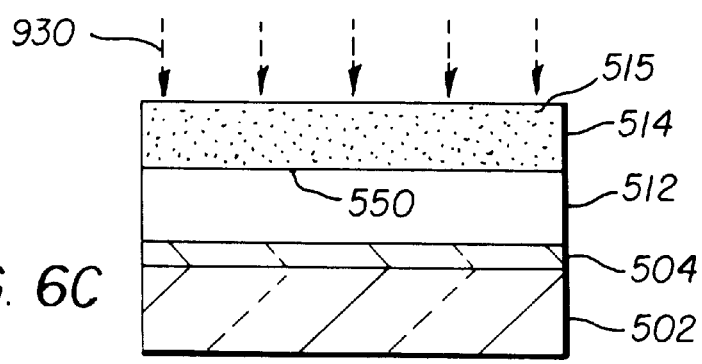

In FIG. 6C a fluid vapor 930 has uniformly diffused the dopant material 515 from the dopant layer 513 of FIG. 6B to form a doped light-emitting layer 514, which is shown here as containing the dopant in a single light-emitting host material.

Figure 6D:
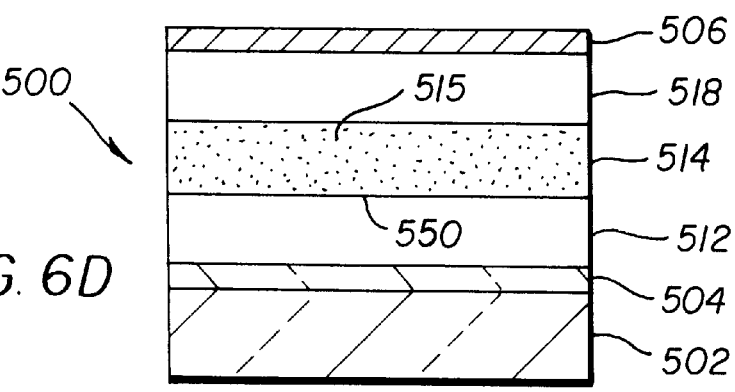

FIG. 6D depicts a completed organic light-emitting device 500 constructed by a method in accordance with the present invention.

Figure 7A:
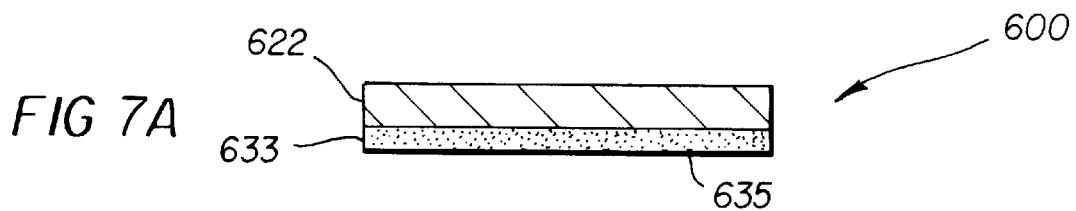
FIG. 7A shows schematically a dopant donor assembly comprised of a donor support and a dopant donor layer formed on a surface of the support.
Figure 7B:
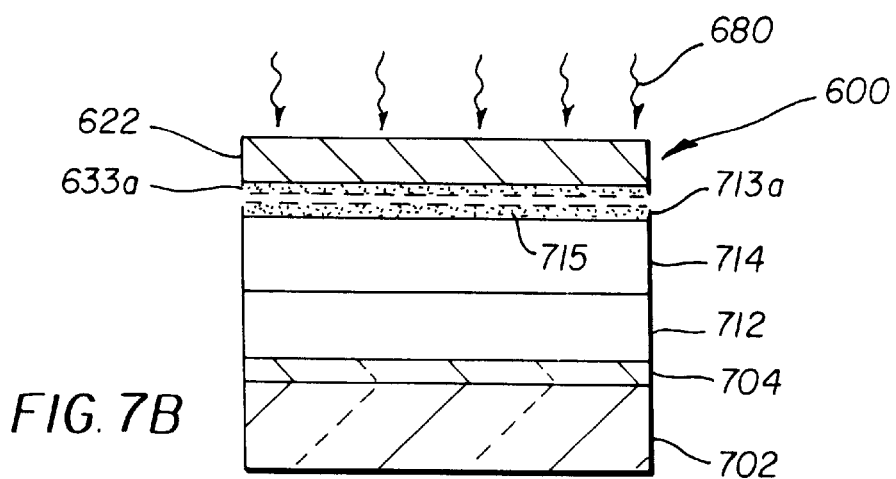
FIG. 7B indicates schematically a thermally induced transfer step in which the dopant donor layer on the support is transferred by heating the donor support to form a growing dopant layer over an organic light-emitting layer of a device.
Figure 7C:
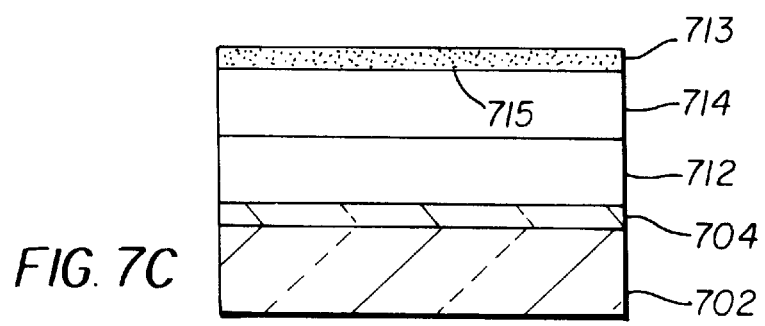
FIG. 7C shows the resulting transferred dopant layer formed over the light-emitting layer.

Turning now to FIGS. 7A–7C, a dopant donor assembly 600 has a donor support 622, and a dopant donor layer 633 formed on one surface of the support, and containing a dopant 635. The dopant donor layer 633 can be formed by conventional vacuum vapor deposition methods to a desired thickness, and of one of the preferred fluorescent dye dopant materials discussed previously.

In FIG. 7B the dopant donor assembly 600 is shown positioned in close proximity to, and substantially parallel with, an upper surface of a light-emitting layer 714 which is to receive a dopant layer by thermally induced transfer of the dopant 635 in the dopant donor layer 633. To effect the donor transfer, the donor support is heated by radiation 680. A diminishing or diminished dopant donor layer 633a is indicated, as well as a growing dopant donor layer 713a being formed into a completely transferred dopant layer 713 shown in FIG. 7C. In the configuration of FIG. 7C, the dopant 715 in the dopant layer 713 can now be diffused into the light-emitting layer 714 in a manner identical to the previously discussed dopant diffusing step.

Figure 8A:
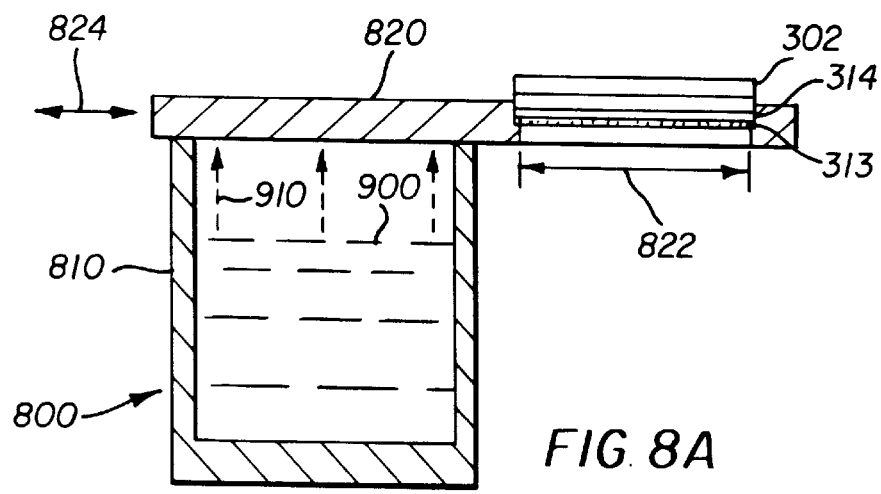
Figure 8B:
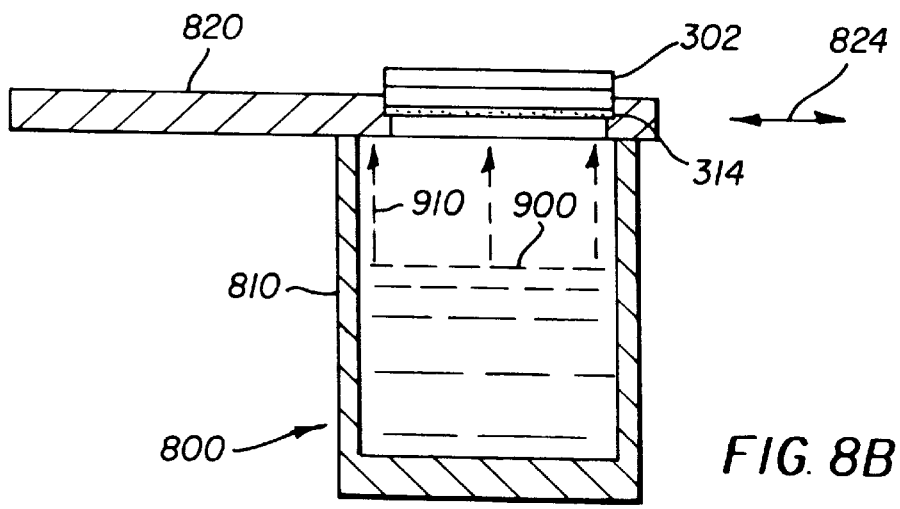

Turning now to FIGS. 8A and 8B, a vapor treatment system 800 is schematically indicated comprising a container 810 which contains a vaporizable fluid to a level 900, the fluid producing a fluid vapor 910, shown by dashed arrows, in a volume extending between a sealed sliding cover 820 and the fluid level 900. The sliding cover has a recessed aperture 822 into which can be positioned a device in preparation for diffusion of a dopant from a dopant layer into a light-emitting layer. As shown here as an illustrative example only is a device having a light-emitting layer 314 and an overlying dopant layer 313.

In FIG. 8B, the sliding cover has been translated by a sliding motion as indicated at 824, so as to expose the dopant layer and the light-emitting layer to the fluid vapor 910 for a defined period of time, and to thereby diffuse the dopant material from the dopant layer 313 into the light-emitting layer 314.

It will be appreciated that a vapor treatment system can be readily constructed to control vapor formation within the container 810 by heating and/or cooling means (not shown) surrounding the interior or exterior of the container.

Numerous fluids and fluid mixtures can be selected to provide fluid vapors useful for diffusing a dopant from a dopant layer into a light-emitting layer at or near room temperature. For example, fluids and fluid mixtures can be selected from among alcohols such as isopropanol; ketones, such as acetone and 2-butanone; and chlorinated fluids, such as dichloromethane.

EXAMPLES

The following examples are presented for a further understanding of the invention. For purposes of clarity, the material and the layers formed therefrom will be abbreviated as given below.

ITO: indium tin oxide (anode)

NPB: 4,4'-bis-[N-(1-naphthyl)-N-phenylamino]-biphenyl (hole-transporting layer)

Alq: tris(8-quanolinato-Nl,08)-aluminum (light-emitting layer; electron-transporting layer)

MgAg: magnesium:silver at a ratio of 10:1 by volume (cathode)

DCJTB: 4-(dicyanomethylene)-2-t-butyl-6-(1,1,7,7-tetramthyljulolidyl-9-enyl)-4H-pyran (dopant)

Example 1

A device, designated for measurement of photoluminescence, was constructed as follows:

a) a light-transmissive anode of ITO-coated glass was ultrasonicated in a commercial detergent, rinsed in deionized water, degreased in toluene vapor, and contacted by a strong oxidizing agent;

b) a 35 nm thick first Alq light-emitting layer was deposited over the ITO anode by conventional vacuum evaporation;

c) a 2.1 nm thick DCJTB dopant layer was formed over the first light-emitting layer by conventional vacuum evaporation;

d) a 35 nm thick second Alq light-emitting layer was formed over the DCJTB dopant layer by conventional vacuum evaporation. This device is abbreviated as:
ITO/Alq(35)/DCJTB(2.1)/Alq(35)

Example 2

A device was constructed in the manner of Example 1, but with an additional dopant diffusion step in isopropanol vapor for 8 seconds. This device is abbreviated as:

ITO/Alq(35)/DCJTB(2.1)/Alq(35)/8 sec isopropanol vapor

The spectral distribution of the photoluminescence (fluorescence) of both devices was measured in a spectrofluorometer, Fluoro Max-2 manufactured by Instruments S.A., Inc., at a fixed excitation wavelength of 390 nm. The relative fluorescence intensity is measured as counts per second (cps).

Figure 9:
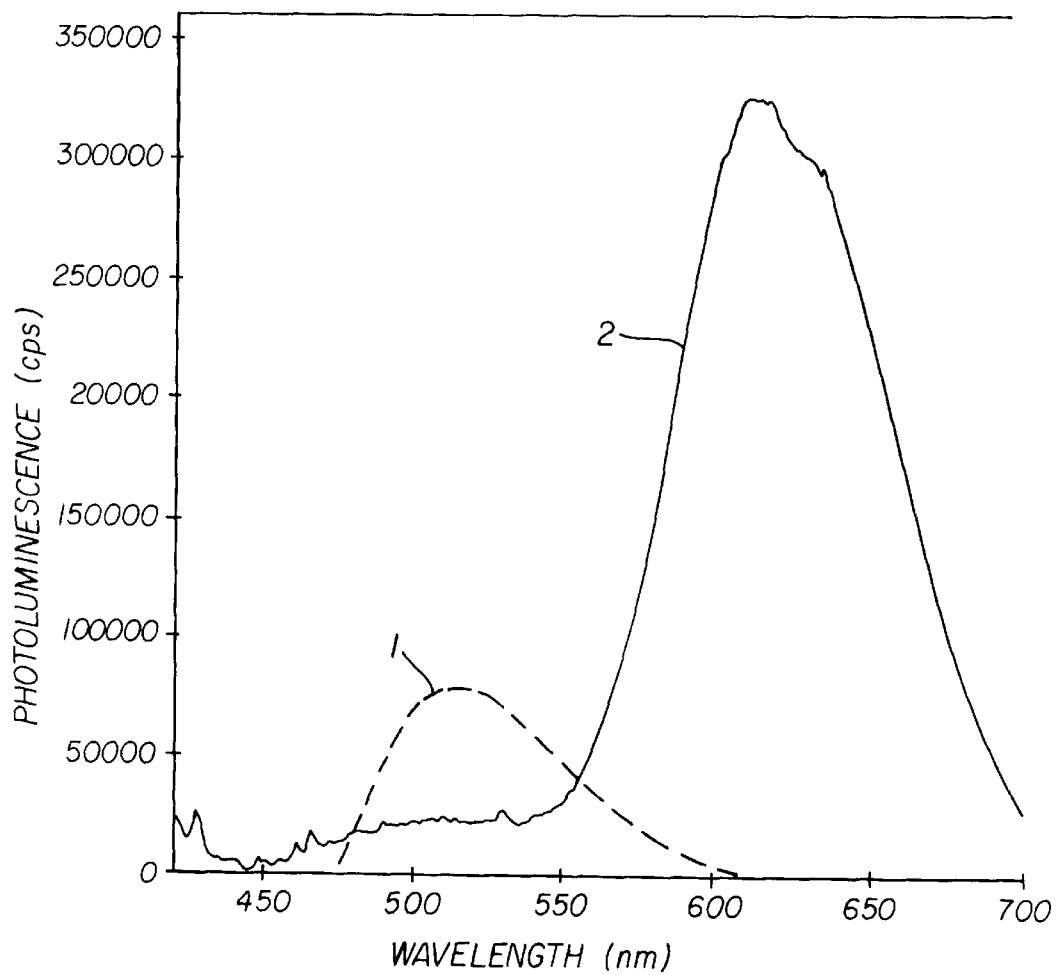
FIG. 9 shows the spectral distribution of photoluminescence before (trace 1) and after dopant diffusion (trace 2) of a dopant from a dopant layer into a first and second organic light-emitting layer of a structure similar to the sequence shown in FIGS. 6B and 6C.

FIG. 9 shows that device 1 (Example 1; dashed trace) has a fluorescence emission peak in a blue-green spectral region centered at about 515 nm, characteristic of the photoluminescence of undoped Alq host material. Device 2 (Example 2; solid trace) exhibits a significantly red-shifted emission with a peak emission at about 610 nm, and having a significantly higher photoluminescence peak intensity. Thus, diffusing the DCJTB dopant from the 2.1 nm dopant layer into the first and second Alq light-emitting layers has resulted in significant modification of the photoluminescence of the Alq host layer.

Example 3

An organic light-emitting device was constructed in the following manner:

a) a light-transmissive anode of ITO-coated glass was ultrasonicated in a commercial detergent, rinsed in deionized water, degreased in toluene vapor, and contacted by a strong oxidizing agent;

b) a 75 nm thick NPB hole-transporting layer was formed over the ITO anode by conventional vacuum evaporation;

c) a 10 nm thick Alq light-emitting host layer was formed over the NPB hole-transporting layer by conventional vacuum evaporation;

d) a 0.3 nm thick DCJTB dopant layer was formed over the 10 nm Alq layer by conventional vacuum evaporation;

e) a 45 nm thick Alq electron-transporting layer was formed over the DCJTB dopant layer by conventional vacuum evaporation;

f) a 150 nm thick MgAg cathode was formed over the electron-transporting layer by vacuum co-evaporation of Mg and of Ag from independently controlled deposition sources.

This device is abbreviated as:
ITO/NPB(75)/Alq(10)/DCJTB(0.3)/Alq(45)/MgAg(150)

Example 4

An organic light-emitting device was made in the following manner:

steps a) through d) of Example 3 were repeated;

e) the DCJTB dopant was diffused into the Alq(10) light-emitting layer by a dopant diffusion step in 2-butanone vapor for 15 seconds;

f) a 45 nm thick Alq electron-transporting layer was formed over the now doped Alq(10) light-emitting layer by conventional vacuum evaporation;

g) a 150 nm thick MgAg cathode was formed over the electron-transporting layer as in step f) of Example 3.

This device is abbreviated as:
ITO/NPB(75)/Alq(10)/DCJTB(0.3)/15 sec 2-butanone vapor/Alq(45)MgAg(150)

The devices of Examples 3 and 4 were operated by applying a drive voltage between respective anode and cathode electrodes, with the anodes biased positively. The drive voltage was adjusted so that each device operated at a current density of 20 mA/cm$^2$.

The spectral radiance of the emitted light was measured with equipment available from Photo Research Laboratory (Model (PR650)).

Figure 10:
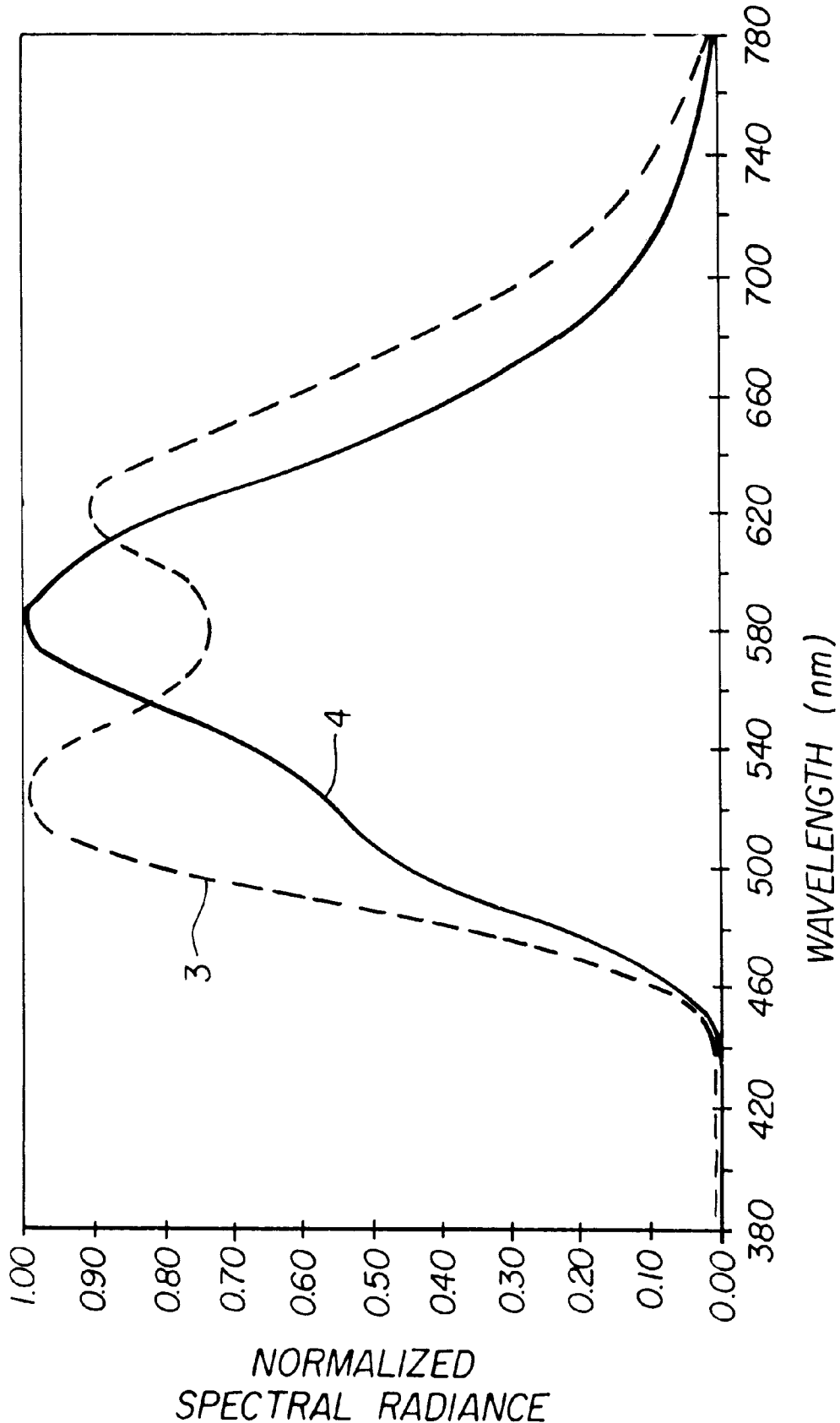
FIG. 10 shows a normalized spectral radiance of an organic light-emitting device made in accordance with the present invention (trace 4) and of a similarly fabricated device in which the dopant was not diffused (trace 3)

FIG. 10 depicts the normalized electroluminescent spectral radiance traces of device 3 (Example 3; dashed trace) and of device 4 (Example 4; solid trace). It is apparent that device 4 exhibits a spectral radiance resembling the characteristics of the dopant DCJTB having a radiance peak at 580 nm. Device 3 exhibits a spectral radiance resembling the characteristics of a combination of host Alq and dopant DCJTB with a first peak at about 520 nm and a second peak at about 620 nm. The luminous efficiency, given in lumen/Watt, was 0.42 for device 3, and 1.16 for device 4, indicating that the device with diffused dopants in the emitting layer is substantially higher than the undiffused device.

Example 5

An organic light-emitting device was made in the following manner:

steps a) and b) of Example 3 were repeated;

c) a 0.5 nm thick DCJTB dopant layer was formed over the 75 nm thick NPB hole-transporting layer by conventional vacuum evaporation;

d) a 25 nm thick Alq light-emitting host layer was formed over the DCJTB dopant layer by conventional vacuum evaporation;

e) a 45 nm thick Alq electron-transporting layer was formed over the 25 nm Alq light-emitting layer by conventional vacuum evaporation;

f) a 150 nm thick MgAg cathode was formed over the electron-transporting layer as in step f) of Example 3.

This device is abbreviated as:
ITO/NPB(75)/DCJTB(0.5)/Alq(25)/Alq(45)MgAg(150)

Example 6

Steps a) through d) of Example 5 were repeated.

e) the DCJTB dopant was diffused into the Alq(25) light-emitting layer by a dopant diffusion step in acetone vapor for 15 seconds;

f) a 45 nm thick Alq electron-transporting layer was formed over the doped light-emitting layer by conventional vacuum evaporation;

f) a 150 nm thick MgAg cathode was formed over the electron-transporting layer as in step f) of Example 3.

The device is abbreviated as:

ITO/NPB(75)/DCJTB(0.5)/Alq(25)/15 sec acetone vapor/Alq(45)/MgAg(150)

The devices of Examples 5 and 6 were operated by applying a drive voltage between respective anode and cathode electrodes, with the anodes biased positively. The drive voltage was adjusted so that each device operated at a current density of 20 mA/cm$^2$.

The spectral radiance of the emitted light was measured with equipment available from Photo Research Laboratory (Model (PR650)).

Figure 11:
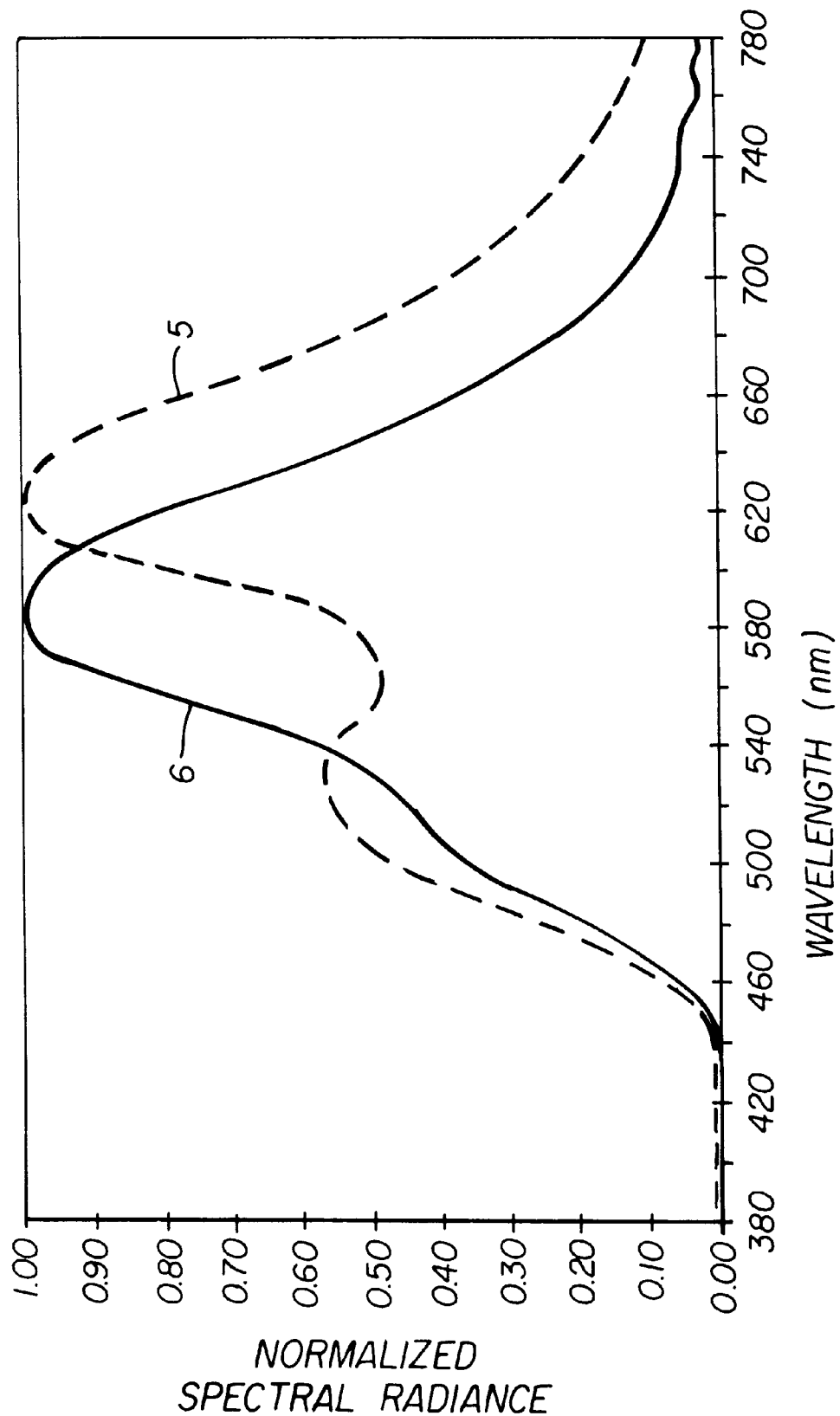
FIG. 11 shows a normalized spectral radiance of an organic light-emitting device made by a method of the present invention (trace 6), and of a similarly prepared organic light-emitting device in which the dopant was not diffused (trace 5).

FIG. 11 depicts the normalized electroluminescent spectral radiance traces of device 5 (Example 5; dashed trace) and of device 6 (Example 6; solid trace). It is apparent that device 6 exhibits a spectral radiance resembling the characteristics of the dopant DCJTB having a radiance peak at 585 nm. Device 5 exhibits a spectral radiance resembling the characteristics of a combination of host Alq and dopant DCJTB with a first peak at about 530 nm and a second peak at about 625 nm. The luminous efficiency, given in lumen/Watt, was 0.25 for device 5, and 1.28 for device 6, indicating that the device with diffused dopants in the emitting layer is substantially higher than the undiffused device.

The invention has been described in detail with particular reference to certain preferred embodiments thereof, but it will be understood that variations and modifications can be effected within the spirit and scope of the invention.

What is claimed is:

1. A method of making an organic light-emitting device, comprising the steps of:
   a) providing a substrate;
   b) disposing an anode over the substrate;
   c) forming an organic hole-transporting layer over the anode;
   d) forming an organic light-emitting layer over the hole-transporting layer and of a light-emitting host material selected to produce a host light emission;
   e) forming at least one organic dopant layer over the light-emitting layer and of a dopant selected to modify the host light emission of the host material;
   f) diffusing the dopant from the dopant layer into the light-emitting layer, thereby modifying the host light emission;
   g) forming an organic electron-transporting layer over the light-emitting layer; and
   h) disposing a cathode over the electron-transporting layer.

2. The method of making an organic light-emitting device in accordance with claim 1 wherein the substrate providing step includes providing a light-transmissive and electrically insulative substrate.

3. The method of making an organic light-emitting device in accordance with claim 2 wherein the anode disposing step includes disposing a light-transmissive anode over the substrate and of an anode material selected to provide hole injection from the anode into the hole-transporting layer.

4. The method of making an organic light-emitting device in accordance with claim 1 wherein the hole-transporting layer forming step includes vapor depositing an organic hole-transporting material selected from the group consisting of aromatic tertiary amines.

5. The method of making an organic light-emitting device in accordance with claim 1 wherein the light-emitting layer forming step includes vapor depositing an organic light-emitting host material selected from the group consisting of metal chelated oxinoid compounds.

6. The method of making an organic light-emitting device in accordance with claim 1 wherein the light-emitting layer forming step includes solution coating a polymeric organic light-emitting host material selected from the group consisting of polyparaphenylene vinylene (PPV), PPV copolymers, polyanilines, poly-3-alkylthiophenes, poly-3-octylthiophenes, and polyparaphenylenes.

7. The method of making an organic light-emitting device in accordance with claim 1 wherein the dopant layer forming step includes vapor depositing a fluorescent dye.

8. The method of making an organic light-emitting device in accordance with claim 7 wherein the fluorescent dye vapor depositing step includes vapor depositing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

9. The method of making an organic light-emitting device in accordance with claim 1 wherein the dopant layer forming step includes the steps of:
   a) providing a dopant layer on a support;
   b) positioning the dopant layer in close proximity to the organic light-emitting layer; and
   d) transferring the dopant from the dopant layer on the support to the light-emitting layer by heating the support.

10. The method of making an organic light-emitting device in accordance with claim 9 wherein the dopant layer providing step includes vapor depositing a fluorescent dye over a surface of the support.

11. The method of making an organic light-emitting device in accordance with claim 10 wherein the fluorescent dye vapor depositing step includes vapor depositing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

12. The method of making an organic light-emitting device in accordance with claim 1 wherein the dopant diffusing step includes exposing the dopant layer and the light-emitting layer to vapor of a fluid or of a fluid mixture selected to provide molecular diffusion paths in the light-emitting layer which permit uniform diffusion of the dopant throughout the host material of the light-emitting layer.

13. The method of making an organic light-emitting device in accordance with claim 1 wherein the electron-transporting layer forming step includes vapor depositing an organic electron-transporting material selected from the group consisting of metal chelated oxinoid compounds.

14. The method of making an organic light-emitting device in accordance with claim 1 wherein the cathode disposing step includes vapor depositing a cathode and of a cathode material selected to provide electron injection from the cathode into the electron-transporting layer.

15. The method of making an organic light-emitting device in accordance with claim 1 wherein the dopant layer forming step includes the steps of:
   a) forming a first organic dopant layer adjacent to the light-emitting layer; and
   b) forming a second organic dopant layer adjacent to the light-emitting layer or the first dopant layer and of a dopant selected to further modify the host light emission of the host material.

16. The method of making an organic light-emitting device in accordance with claim 15 wherein the dopant diffusing step includes exposing the first and second dopant layers and the light-emitting layer to vapor of a fluid or of a fluid mixture selected to provide molecular diffusion paths in the light-emitting layer which permit uniform diffusion of the dopants throughout the host material of the light-emitting layer.

17. A method of making an organic light-emitting device, comprising the steps of:
   a) providing a substrate;
   b) disposing an anode over the substrate;
   c) forming an organic hole-transporting layer over the anode;
   d) forming a first organic light-emitting layer over the hole-transporting layer and of a light-emitting host material selected to produce a host light emission;
   e) forming at least one organic dopant layer over the first light-emitting layer and of a dopant selected to modify the host light emission of the host material;
   f) forming a second organic light-emitting layer over the dopant layer and of a light-emitting host material selected to produce a host light emission;
   g) diffusing the dopant from the dopant layer into the first and second light-emitting layers, thereby modifying the host light emission from the first and second light-emitting layers;
   h) forming an organic electron-transporting layer over the second light-emitting layer; and
   i) disposing a cathode over the electron-transporting layer.

18. The method of making an organic light-emitting device in accordance with claim 17 wherein the substrate providing step includes providing a light-transmissive and electrically insulative substrate.

19. The method of making an organic light-emitting device in accordance with claim 18 wherein the anode disposing step includes disposing a light-transmissive anode over the substrate and of an anode material selected to provide hole injection from the anode into the hole-transporting layer.

20. The method of making an organic light-emitting device in accordance with claim 17 wherein the hole-transporting layer forming step includes vapor depositing an organic hole-transporting material selected from the group consisting of aromatic tertiary amines.

21. The method of making an organic light-emitting device in accordance with claim 17 wherein the steps of forming the first and second light-emitting layers includes vapor depositing an organic light-emitting host material selected from the group consisting of metal chelated oxinoid compounds.

22. The method of making an organic light-emitting device in accordance with claim 17 wherein the step of forming the first light-emitting layer includes solution coating a polymeric organic light-emitting host material selected from the group consisting of polyparaphenylene vinylene (PPV), PPV copolymers, polyanilines, poly-3-alkylthiophenes, poly-3-octylthiophenes, and polyparaphenylenes.

23. The method of making an organic light-emitting device in accordance with claim 17 wherein the dopant layer forming step includes vapor depositing a fluorescent dye.

24. The method of making an organic light-emitting device in accordance with claim 23 wherein the fluorescent dye vapor depositing step includes vapor depositing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

25. The method of making an organic light-emitting device in accordance with claim 17 wherein the dopant layer forming step includes the steps of:
   a) providing a dopant layer on a support;
   b) positioning the dopant layer in close proximity to the first organic light-emitting layer; and
   c) transferring the dopant from the dopant layer on the support to the first light-emitting layer by heating the support.

26. The method of making an organic light-emitting device in accordance with claim 25 wherein the dopant layer providing step includes vapor depositing a fluorescent dye over a surface of the support.

27. The method of making an organic light-emitting device in accordance with claim 26 wherein the fluorescent dye vapor depositing step includes vapor depositing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

28. The method of making an organic light-emitting device in accordance with claim 25 wherein the cathode disposing step includes vapor depositing a cathode and of a cathode material selected to provide electron injection from the cathode into the electron-transporting layer.

29. The method of making an organic light-emitting device in accordance with claim 17 wherein the dopant diffusing step includes exposing the second light-emitting layer, the dopant layer, and the first light-emitting layer to vapor of a fluid or of a fluid mixture selected to provide molecular diffusion paths in the second and first light-emitting layers which permit uniform diffusion of the dopant throughout the host material of the second and first light-emitting layers.

30. The method of making an organic light-emitting device in accordance with claim 17 wherein the electron-transporting layer forming step includes vapor depositing an organic electron-transporting material selected from the group consisting of metal chelated oxinoid compounds.

31. The method of making an organic light-emitting device in accordance with claim 17 wherein the cathode disposing step includes vapor depositing a cathode and of a cathode material selected to provide electron injection from the cathode into the electron-transporting layer.

32. A method of making an organic light-emitting device, comprising the steps of:
   a) providing a substrate;
   b) disposing an anode over the substrate;
   c) forming an organic hole-transporting layer over the anode;
   d) forming at least one organic dopant layer over the hole-transporting layer and of a dopant selected to modify a host light emission of a host material in a light-emitting layer;
   e) forming an organic light-emitting layer over the dopant layer and of a light-emitting host material selected to produce a host light emission;
   f) diffusing the dopant from the dopant layer into the light-emitting layer, thereby modifying the host light emission;
   g) forming an organic electron-transporting layer over the light-emitting layer; and
   h) disposing a cathode over the electron-transporting layer.

33. The method of making an organic light-emitting device in accordance with claim 32 wherein the substrate providing step includes providing a light-transmissive and electrically insulative substrate.

34. The method of making an organic light-emitting device in accordance with claim 33 wherein the anode disposing step includes disposing a light-transmissive anode over the substrate and of an anode material selected to provide hole injection from the anode into the hole-transporting layer.

35. The method of making an organic light-emitting device in accordance with claim 32 wherein the hole-transporting layer forming step includes vapor depositing an organic hole-transporting material selected from the group consisting of aromatic tertiary amines.

36. The method of making an organic light-emitting device in accordance with claim 32 wherein the dopant layer forming step includes vapor depositing a fluorescent dye.

37. The method of making an organic light-emitting device in accordance with claim 36 wherein the fluorescent dye vapor depositing step includes vapor depositing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

38. The method of making an organic light-emitting device in accordance with claim 32 wherein the dopant layer forming step includes the steps of:

a) providing a dopant layer on a support;

b) positioning the dopant layer in close proximity to the organic hole-transporting layer; and c) transferring the dopant from the dopant layer on the support to the hole-transporting layer by heating the support.

39. The method of making an organic light-emitting device in accordance with claim 38 wherein the dopant layer providing step includes vapor depositing a fluorescent dye over a surface of the support.

40. The method of making an organic light-emitting device in accordance with claim 39 wherein the fluorescent dye vapor depositing step includes vapor depositing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

41. The method of making an organic light-emitting device in accordance with claim 32 wherein the dopant diffusing step includes exposing the dopant layer and the light-emitting layer to vapor of a fluid or of a fluid mixture selected to provide molecular diffusion paths in the light-emitting layer which permit uniform diffusion of the dopant throughout the host material of the light-emitting layer.

42. The method of making an organic light-emitting device in accordance with claim 32 wherein the electron-transporting layer forming step includes vapor depositing an organic electron-transporting material selected from the group consisting of metal chelated oxinoid compounds.

* * * * *